United States Patent
Liu et al.

(10) Patent No.: US 9,863,572 B2
(45) Date of Patent: Jan. 9, 2018

(54) LIFTING DEVICE AND ELECTRONIC SYSTEM

(71) Applicant: ENNOCONN CORPORATION, New Taipei (TW)

(72) Inventors: Shih-Chi Liu, New Taipei (TW); Shih-Tse Chen, New Taipei (TW)

(73) Assignee: ENNOCONN CORPORATION, New Taipei (TW)

( * ) Notice: Subject to any disclaimer, the term of this patent is extended or adjusted under 35 U.S.C. 154(b) by 0 days.

(21) Appl. No.: 15/059,801

(22) Filed: Mar. 3, 2016

(65) Prior Publication Data

US 2017/0205021 A1    Jul. 20, 2017

(30) Foreign Application Priority Data

Jan. 20, 2016    (CN) .......................... 2016 1 0036080

(51) Int. Cl.
*F16M 11/04* (2006.01)
*H05K 5/00* (2006.01)
*F16M 11/18* (2006.01)
*H05K 5/02* (2006.01)

(52) U.S. Cl.
CPC ........... *F16M 11/046* (2013.01); *F16M 11/18* (2013.01); *H05K 5/0017* (2013.01); *H05K 5/0204* (2013.01)

(58) Field of Classification Search
CPC ........... G06F 1/1626; G06F 2200/1614; G06F 1/1632; F16M 11/18; F16M 11/10; F16M 13/02; F16M 11/046; F16M 11/38; F16M 11/048; F16M 11/2014; F16M 11/2064; F16M 11/2085; F16M 11/425; F16M 13/027; F16M 2200/047; F16M 2200/063; F16M 2200/066; H05K 5/0017; H05K 5/0204
USPC ............ 361/679.01, 679.02, 679.22, 679.26, 361/679.27, 679.21, 679.09; 248/917–924
See application file for complete search history.

(56) References Cited

U.S. PATENT DOCUMENTS

| 8,405,959 B2 * | 3/2013 | Lee ...................... F16M 11/046 248/125.2 |
| 2006/0011788 A1 * | 1/2006 | Jang .................... F16M 11/105 248/132 |

* cited by examiner

*Primary Examiner* — Anthony Haughton
*Assistant Examiner* — Ingrid Wright
(74) *Attorney, Agent, or Firm* — ScienBiziP, P.C.

(57) ABSTRACT

A lifting device configured to adjustably hold a display device at a certain height includes a support frame configured to support the display device, a shaft, a toothed gear, and a rack secured on the support frame. The shaft includes a wide portion secured on the display device and a narrow portion carrying the toothed gear, friction between the wide portion and the narrow portion being sufficient to hold the static weight of the display device. The toothed gear meshes with the rack. An upward or downward push on the display device drives the gear to move up and down along the rack to adjust the height of the display device.

16 Claims, 5 Drawing Sheets

LIFTING DEVICE AND ELECTRONIC SYSTEM

CROSS-REFERENCE TO RELATED APPLICATIONS

This application claims priority to Chinese Patent Application No. 201610036080.5 filed on Jan. 20, 2016, the contents of which are incorporated by reference herein.

FIELD

The subject matter herein generally relates to lifting devices, and more particularly to a lifting device for a display device.

BACKGROUND

Displays such as a liquid crystal display and other display devices are widely used in personal computers and TVs. In order to provide a better viewing angle, an adjusting device can be provided to rotate the display devices.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
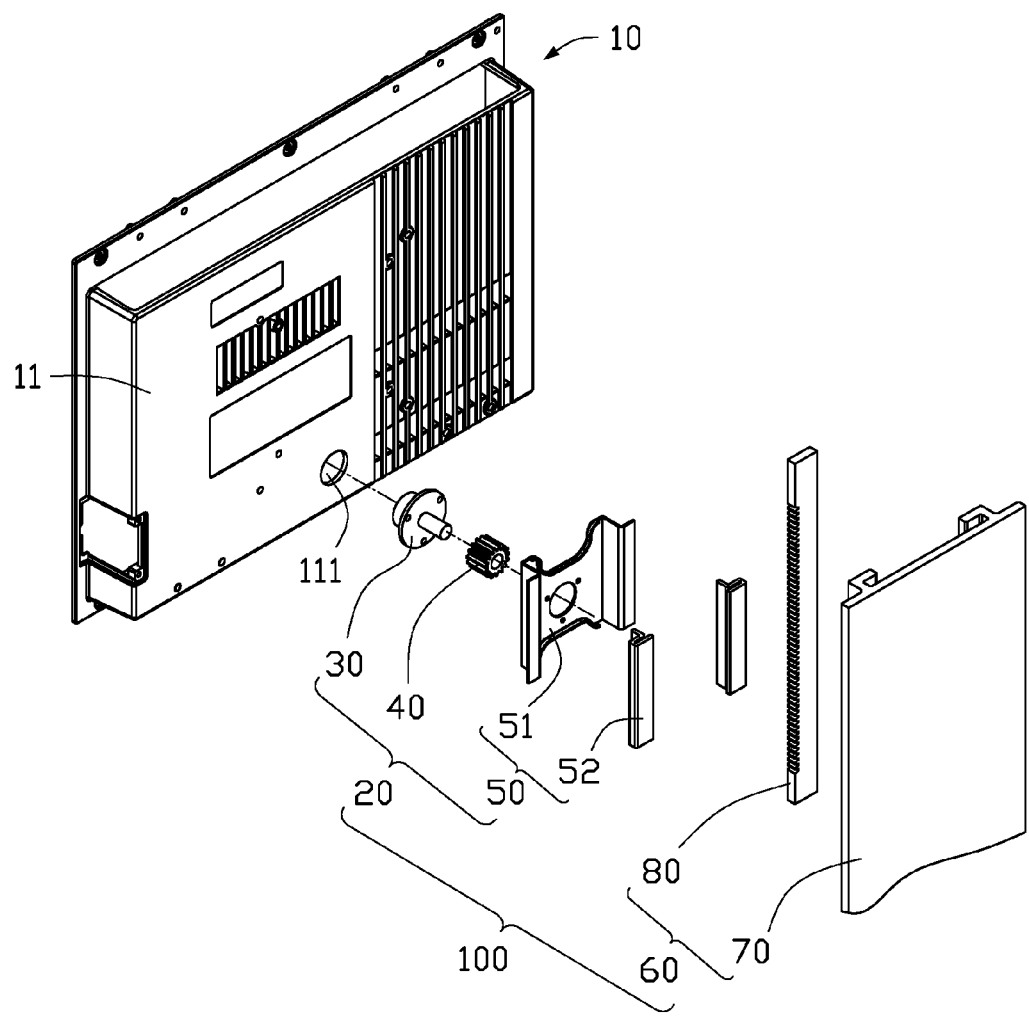
FIG. 1 is an exploded, isometric view of an embodiment of a lifting device and a display device to be lifted.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series and the like.

Figure 2:
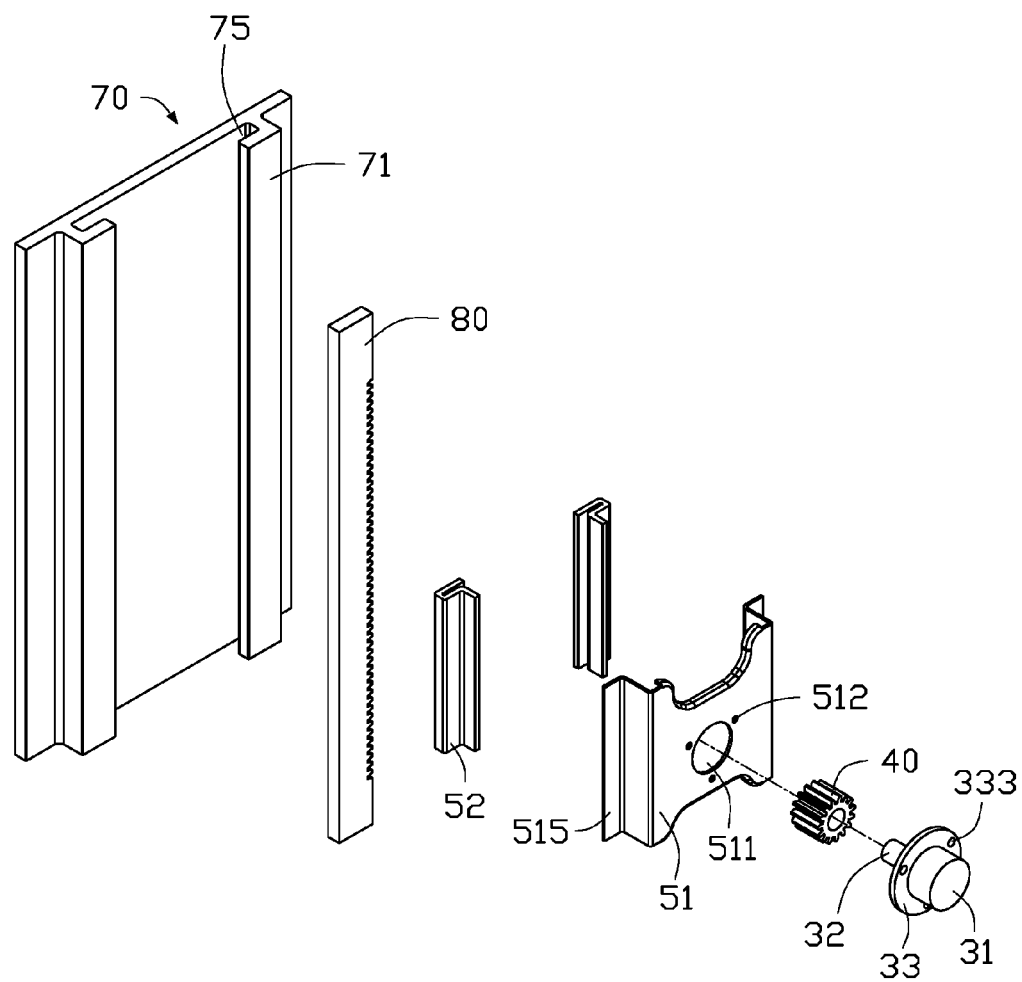
FIG. 2 is an exploded, isometric view of the lifting device of FIG. 1.

FIGS. 1 and 2 illustrate one embodiment of an electronic system including a display device 10 and a lifting device 100 configured to adjust the height of the display device 10. The lifting device 100 includes a securing module 20 secured on the display device 10 and a support module 50 configured to support the display device 10.

The front of the electronic device 10 includes a screen (not shown), and the back of the electronic device 10 includes a back shell 11. A positioning hole 111 is defined on the back shell 11.

The securing module 20 includes a shaft 30, a gear 40 secured on the shaft 30, and a securing member 50. The shaft 30 includes a wide portion 31 and a narrow portion 32 rotatably installed in the wide portion 31. The wide portion 31 is configured to be inserted into the positioning hole 111. The physical contact between the wide portion 31 and the narrow portion 32 is such that a high degree of static friction exists between the two. When an external force exceeds the static friction force between the wide portion 31 and the narrow portion 32, the narrow portion 32 is rotated in the wide portion 31. A securing ring 33 surrounds an end of the wide portion 32 which is close to the narrow portion 32. A plurality of securing holes 333 is defined on the securing ring 33. The gear 40 is secured on an end of the narrow portion 32 which is away from the wide portion 31. The gear 40 rotates with the narrow portion 32.

The securing member 50 includes a backboard 51 and two sliding rails 52 secured on the backboard 51. The middle portion of the backboard 51 defines a through hole 511. The narrow portion 32 and the gear 40 can pass through the through hole 511. A plurality of locking holes 512 is located around the through hole 511. A plurality of fasteners (not shown) is configured to pass through the securing holes 333 and be inserted into the locking holes 512 to secure the shaft 30 on the backboard 51. Folded pieces 515 are on the two sides of the backboard 51, and the sliding rail 52 can be secured on the folding piece 515.

The support module 60 includes a support frame 70 and a rack 80. One side of the support frame 70 is equipped with two parallel limiting plates 71. Each limiting plate 71 is substantially an "L" shape. A slideway 75 is defined between each limiting plate 71 and the support frame 70. The bottom end of the support frame 70 is equipped with a base (not shown) to support the display device 10. The rack 80 is secured on the support frame 70 and is located between the two limiting plates 71. The gear 40 is meshed with the rack 80 and rotates up and down the rack 80. In at least one embodiment, the length of the rack 80 can be arbitrarily increased to increase the adjustable range of the height of the display device 10.

Figure 3:
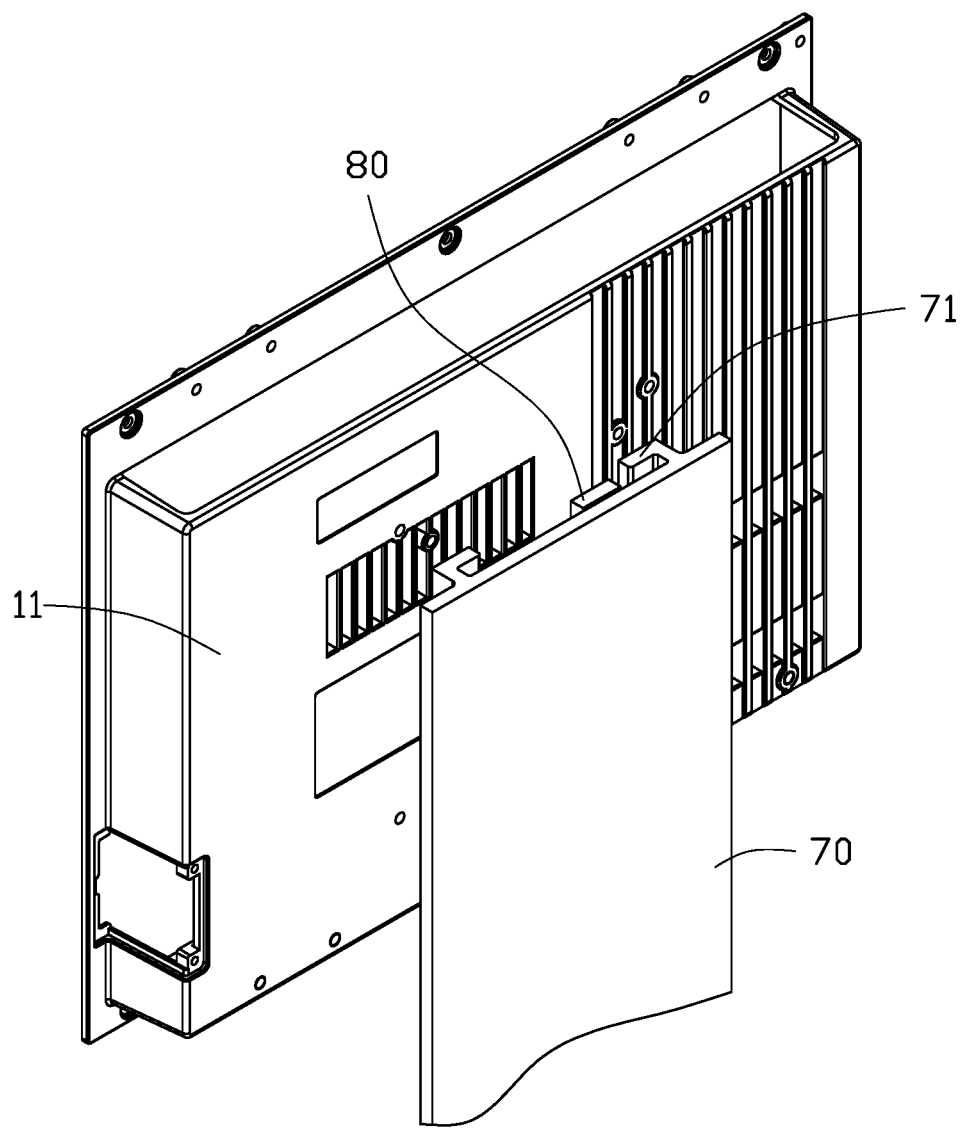
FIG. 3 is an assembled, isometric view of the lifting device and the electronic device of FIG. 1.
Figure 4:
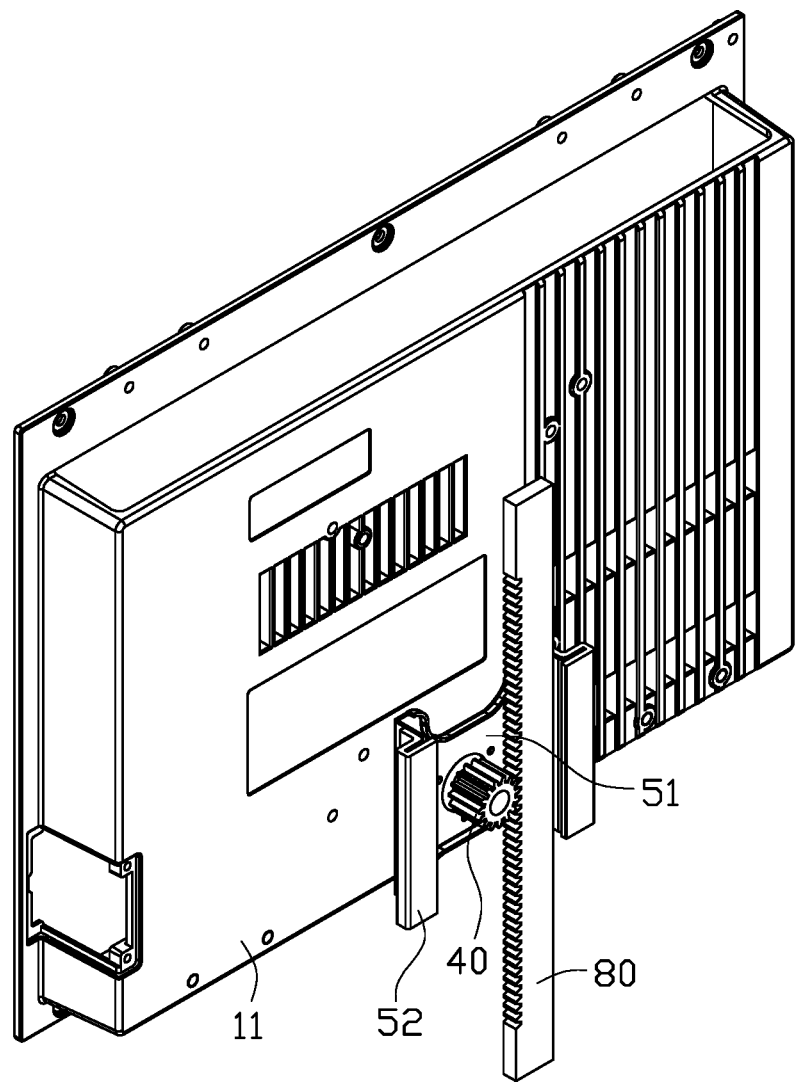
FIG. 4 is similar to FIG. 3, with the support frame omitted.

FIGS. 3 and 4 illustrate assembly, in which the gear 40 is secured on the narrow portion 31. The gear 40 and the narrow portion 32 pass through the through hole 511 until the securing ring rests against the backboard 51. The securing ring 33 is rotated to align the securing holes 333 with the locking holes 512. The fasteners pass through the securing holes 333 to be inserted into the locking holes 512 to secure the shaft 30 on the backboard 51. The two sliding rails 52 are secured on the two folding pieces 515. The securing module 20 is thus completely assembled.

The rack 80 is secured on the support frame 70, and the support module 50 is thus completely assembled. The securing module 20 is located on the support module 50. The two sliding rails 52 are inserted into the slideways 75. The rack 80 is located between the gear 40 and one of the limiting plates 71. The gear 40 is meshed with the rack 80 to slidably install the securing module 20 on the support module 50. The lifting device 100 is thus completely assembled.

The wide portion 31 of the shaft 30 is inserted into the positioning hole 111 of the back shell 11 to secure the display device 10 on the lifting device 100. The weight of the display device 10 provides less gravitational force than is required to overcome the static friction between the wide portion 31 and the narrow portion 32, and the height of the display device 10 remains unchanged.

Figure 5:
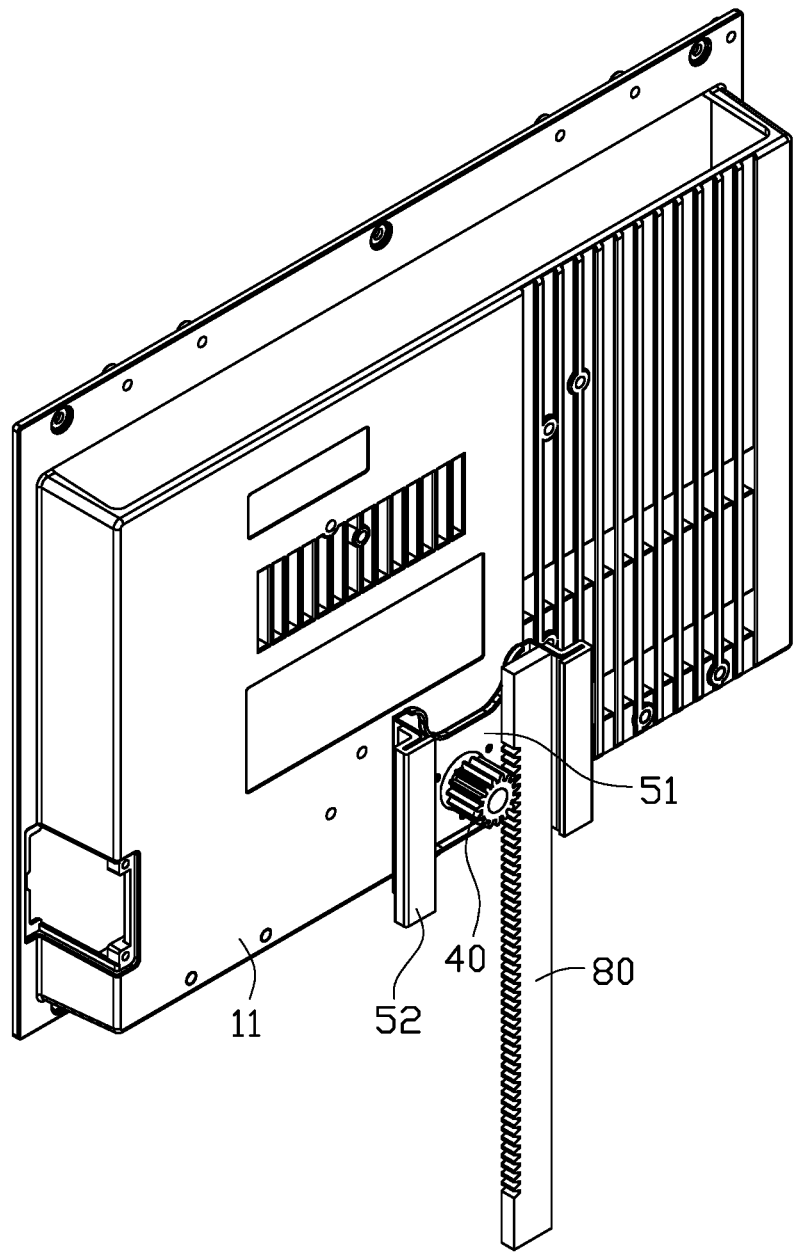
FIG. 5 is similar to FIG. 4, showing the display device at a different height.

FIG. 5 illustrates that when the height of the display 10 is required to be raised or lowered, the display device 10 is pushed up or down, and the thrust of the push exceeds the static friction force between the wide portion 31 and the narrow portion 32. The narrow portion 32 and the gear 40 rotate. The meshed gear 40 rotates upward or downward along the rack 80 to drive the sliding rails 52 to slide upward or downward along the slideways 75. The display device 10 is thus moved up or down to adjust its height.

The embodiments shown and described above are only examples. Many details are often found in the art such as the other features of a lifting device. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A lifting device configured to adjust the height of a display device comprising:
   a support frame configured to support the display device;
   a shaft comprising a wide portion secured on the display device and a narrow portion rotatably installed in the wide portion, wherein a static friction exists between the narrow portion and the wide portion, when an external force exceeds the static friction between the wide portion and the narrow portion, the narrow portion is rotated in the wide portion;
   a gear secured on the narrow portion; and
   a rack secured on the support frame;
   wherein the gear is meshed with the rack, the narrow portion is rotatable relative to the wide portion to drive the gear to move up and down along the rack to adjust the height of the display device.

2. The lifting device of claim 1, wherein the lifting device further comprises a securing member, the shaft and the gear are secured on the securing member.

3. The lifting device of claim 2, wherein securing member comprises a backboard, and the backboard defines a through hole, the narrow portion and the gear pass through the through hole.

4. The lifting device of claim 3, wherein the securing member further comprises two sliding rails, and two folding pieces are located two sides of the backboard, the two sliding rails are respectively secured on the two folding pieces.

5. The lifting device of claim 3, wherein a securing ring is located between the wide portion and the narrow portion, and a plurality of fasteners secures the securing ring to the backboard.

6. The lifting device of claim 5, wherein The securing ring defines a plurality of securing holes, and the backboard is defined a plurality of locking holes around the through hole, the fasteners pass through the securing holes and inserted into the locking holes to secure the shaft and the gear on the securing member.

7. The lifting device of claim 1, wherein one side of the support frame is equipped with two parallel limiting plates, each limiting plate is substantially an "L" shape.

8. The lifting device of claim 7, wherein a slide way is located between the support frame and each limiting plate, the lifting device further comprises a securing member, and two ends of the securing member can be received in the slide way and slid along the slide way.

9. An electronic system, comprising:
   a display device; and
   a lifting device comprising:
      a support frame configured to support the display device;
      a shaft comprising a wide portion secured on the display device and a narrow portion rotatably installed in the wide portion, wherein a static friction exists between the narrow portion and the wide portion, when an external force exceeds the static friction between the wide portion and the narrow portion, the narrow portion is rotated in the wide portion;
      a gear secured on the narrow portion; and
      a rack secured on the support frame;
      wherein the gear is meshed with the rack, the narrow portion is rotatable relative to the wide portion to drive the gear to move up and down along the rack to adjust the height of the display device.

10. The electronic system of claim 9, wherein the lifting device further comprises a securing member, the shaft and the gear are secured on the securing member.

11. The electronic system of claim 10, wherein securing member comprises a backboard, and the backboard defines a through hole, the narrow portion and the gear pass through the through hole.

12. The electronic system of claim 11, wherein the securing member further comprises two sliding rails, and two folding pieces are located two sides of the backboard, the two sliding rails are respectively secured on the two folding pieces.

13. The electronic system of claim 11, wherein a securing ring is located between the wide portion and the narrow portion, and a plurality of fasteners secures the securing ring to the backboard.

14. The electronic system of claim 13, wherein the securing ring defines a plurality of securing holes, and the backboard is defined a plurality of locking holes around the through hole, the fasteners pass through the securing holes and inserted into the locking holes to secure the shaft and the gear on the securing member.

15. The electronic system of claim 9, wherein one side of the support frame is equipped with two parallel limiting plates, each limiting plate is substantially an "L" shape.

16. The electronic system of claim 15, wherein a slide way is located between the support frame and each limiting plate, the lifting device further comprises a securing member, and two ends of the securing member can be received in the slide way and slid along the slide way.

* * * * *